United States Patent [19]
Kim et al.

[11] Patent Number: 5,830,331
[45] Date of Patent: Nov. 3, 1998

[54] APPARATUS AND METHOD FOR SPUTTERING CARBON

[75] Inventors: Taesun E. Kim, San Jose; Hyung J. Lee; Yao-Tzung R. Shih, both of Cupertino; John C. Bruno, Martinez; Robert B. Zubeck, Los Altos; Dennis R. Hollars, Los Gatos, all of Calif.

[73] Assignee: Seagate Technology, Inc., Scotts Valley, Calif.

[21] Appl. No.: 311,529

[22] Filed: Sep. 23, 1994

(Under 37 CFR 1.47)

[51] Int. Cl.$^6$ .............................. C23C 14/34; C23C 14/35
[52] U.S. Cl. .............................. 204/192.15; 204/192.12; 204/192.16; 204/192.2; 204/192.22; 204/192.23; 204/298.08; 204/298.11; 204/298.26
[58] Field of Search ........................ 204/192.12, 192.15, 204/192.16, 192.2, 192.22, 192.23, 298.08, 298.11, 298.26

[56] References Cited

U.S. PATENT DOCUMENTS

| | | | |
|---|---|---|---|
| 4,737,419 | 4/1988 | Hilden et al. | 428/695 |
| 4,778,582 | 10/1988 | Howard | 204/192.15 |
| 5,074,983 | 12/1991 | Eltoukhy et al. | 204/192.13 |
| 5,415,757 | 5/1995 | Szcyrbowski et al. | 204/298.08 |
| 5,507,930 | 4/1996 | Yamashita et al. | 204/192.15 |
| 5,512,164 | 4/1996 | Timberlake | 205/186 |
| 5,558,751 | 9/1996 | Mahler et al. | 204/298.26 |

FOREIGN PATENT DOCUMENTS

| | | | |
|---|---|---|---|
| A-0546293 | 6/1993 | European Pat. Off. | 204/192.16 |
| A-0561641 | 9/1993 | European Pat. Off. | 204/298.08 |
| 60-157725 | 8/1985 | Japan . | |

OTHER PUBLICATIONS

"Deposition of Si$_3$N$_4$ with Twinmag Sputtering Cathode", Leybold's Electronics Newsletter, No. 5, Jan. 1994, pp. 14–17.

Scherer, M., et al., "Reactive Alternating Current Magnetron Sputtering of Dielectric Layers", J. Vac. Sci. Technol. A 10(4), Jul./Aug. 1992, pp. 1772–1776.

Este, G., et al., "A Quasi–Direct Current Sputtering Technique for the Deposition of Dielectrics at Enhanced Rates", J. Vac. Sci. Technol. A 6(3), May/Jun. 1988, pp. 1845–1848.

Scholl, R.A., "Process Improvements for Sputtering Carbon and Other Difficult Materials Using Combined AC and DC Process Power", Society of Vacuum Coaters, 35th Annual Technical Conference Proceedings (1992), 1–878068–11–2, pp. 391–392.

Marchon, B., et al., "Structure and Mechanical Properties of Hydrogenated Carbon Films Prepared by Magnetron Sputtering", Center for Advanced Materials, Lawrence Berkely Laboratory, Berkeley, CA.

Dimigen, H., et al., "Tribologial and Electrical Properties of Metal–Containing Hydrogenated Carbon Films", Appl. Phys. Ltr. 50 (16), 20 Apr. 1987, pp. 1056–1058.

Cho, N–H., et al., "Chemical Structure and Physical Properties of Diamond–Like Amorphous Carbon Films Prepared by Magnetron Sputtering", J. Mater, Res., vol. 5, No. 11, Nov. 1990.

Tsai, Hsiao–chu, et al., "Critical Review: Characterization of Diamondlike Carbon Films and Their Application as Overcoats on Thin Film Media for Magnetic Recording", J. Vac. Sci. Technol., A, vol. 5, No. 6, pp. 3267–3312 Nov./Dec. 1987.

*Primary Examiner*—Aaron Weisstuch
*Attorney, Agent, or Firm*—Lowe, Price, LeBlanc & Becker

[57] ABSTRACT

A hydrogenated carbon film for magnetic thin film recording media is manufactured by alternating current magnetron sputtering in an atmosphere containing argon and a hydrocarbon gas. Targets mounted side-by-side cyclically sputter and discharge charge buildup according to an alternating current. Shielding between the targets directs electrons toward the anode at a given time.

15 Claims, 6 Drawing Sheets

APPARATUS AND METHOD FOR SPUTTERING CARBON

BACKGROUND OF THE INVENTION

1. Field of the Invention

This invention relates to an apparatus and method for the manufacture of a magnetic recording disk and, in particular, to an apparatus and method for the manufacture of a disk having a protective overcoat of a hydrogenated carbon film.

2. Description of the Related Art

Dielectric films such as $Al_2O_3$, $Si_3N_4$, $SiO_2$, and carbon have a variety of technical applications. These applications include the use of these films as protective coatings such as for magnetic heads, interlayers for integrated circuits and overlayers for magneto-optical media. In view of the widespread use of these films in high technology applications and the need for precise control of film properties for such applications, film manufacturing processes embodying rapid, high yield, and easy-to-control production methods with high yields are very desirable.

Sputtering techniques have been used to deposit these films. For example, U.S. Pat. No. 4,737,419 relates to a direct current magnetron sputtering process for depositing a carbon overcoat suitable for use over a magnetic recording layer comprising magnetic particles in an organic binder. While direct current (dc) magnetron sputtering of dielectric materials generally is capable of depositing films at economically attractive rates, redeposition of non-electrically conducting dielectric materials onto the sputtering target can cause arcing. Arcing is undesirable since it can disturb sputtering, generate particulate contaminants, and cause the target to break down.

Replacement of dc power with alternating current (ac) power supplies is known to reduce or eliminate arcing because of relatively shorter-lived charge buildup on the dielectric target. For example, Leybold's Electronics Newsletter of January 1994, No. 5, pages 14–17, describes a mid-frequency reactive sputtering process for the deposition of $Si_3N_4$ onto a static substrate. Also, Scherer, et al., in an article entitled "Reactive Alternating Current Magnetron Sputtering of Dielectric Layers", *J. Vac. Sci. Technol. A* 10(4), July/August 1992, pages 1772–1776, teach alternating current reactive magnetron sputtering of $Al_2O_3$, $Si_3N_4$, and $Si_{45}O_{27}N_{28}$. In each of these publications, magnetrons were positioned side-by-side and coupled with a mid-frequency 10 kW power supply working at 40 kHz. Power was split between the magnetrons so that each magnetron acted for one-half of the cycle as a cathode and for the other half of the cycle as a dc-conducting anode to discharge charge buildup, thereby reducing the probability of arcing while maintaining continuous sputtering.

Alternating current magnetron sputtering processes have been used to deposit carbon films. For example, U.S. Pat. No. 4,778,582 relates to carbon films sputtered over a magnetic thin film recording layer. A 200 Å carbon film was formed on a grounded substrate in an atmosphere of argon and hydrogen using a single graphite target supplied with 250 W from an RF power source. While the use of such a high frequency power source in alternating current magnetron sputtering tends to reduce the lifetime of charge buildup due to the high number of cycles per second and therefore the potential for arcing, such power sources are relatively expensive. Also, extensive shielding of the sputtering apparatus from high frequency noise generated by the power supply is required to minimize disturbances of sputtering processes thereby.

It is sometimes desired that only sputtering flux with a particular orientation is deposited onto the substrate. For example, in the deposition of films serving as magnetic thin film recording layers, obliquely incident sputtering flux can cause significant nonuniformities in the deposited film's morphology or thickness or both. Variations in these characteristics of the film can cause variations in film performance and therefore are undesirable. One approach to this problem is to fit sputtering chambers with shields having surfaces intervening in the space between the magnetrons and the surface of the substrate to be coated. These shield surfaces intercept the obliquely incident sputtering flux so that only sputtering flux having a particular angle of incidence relative to the substrate is deposited on the substrate. Thus, film morphology can be controlled.

When used, these shields are positioned to surround each magnetron or to extend from the magnetron to a position between the sputtering target and the substrate. For planar magnetrons, for example, shields typically are panels arranged to form a rectangular structure that circumferentially frames each magnetron and have an opening facing the substrate surface. Flanges of various configurations can extend from each shield toward the substrate surface to increase the amount of flux intercepted.

A drawback to the use of conventional shields in sputtering apparatuses is that the ultimate rate of film deposition onto the substrate may be reduced to an unacceptably low level from an economic perspective. While it may be possible to adjust sputtering process parameters to counteract the reduction, adjustment for these parameters will affect the nature of the film deposited, possibly to the extent that the film is unusable for the original purpose desired.

Carbon films have also been formed by plasma decomposition of hydrocarbon gases or reactive sputtering from a graphite target in the presence of argon and hydrogen or various hydrocarbon gases. With such reactive processes, it is difficult to consistently produce films with desired properties because of difficulties in control of chemical dissociation of reactant species and the site of reaction between the surface upon which deposition is desired and the gaseous environment. Other drawbacks include production of an insulating film on the target inhibiting additional sputtering therefrom, deposition of contaminants onto the substrate, or composition or morphology nonuniformities.

Also, the abstract of Japanese Kokai 60-157725 describes the sputtering of a polymerized hydrocarbon film in an atmosphere containing a gaseous hydrocarbon. Generally, such polymerized films are insufficiently hard to satisfy current specifications for protective overcoats for magnetic thin film recording media.

SUMMARY OF THE INVENTION

The present invention addresses these and other disadvantages in the prior art.

Thus, it is an object of the present invention to provide an easy to control and efficient apparatus and method for sputtering films of dielectric materials such as carbon.

Another object of the present invention is to enhance the deposition rate of a dielectric film produced by alternating current magnetron sputtering.

It is a further object of the present invention to reduce the probability of arcing when sputtering a dielectric material.

An additional object of the present invention is to facilitate tailoring of the properties of the sputtered film.

These and other objects are achieved through an apparatus and a method according to the present invention in which adjacent magnetrons successively act as a sputtering cathode and then as an anode in accordance with the frequency of an alternating current power supply and in which electrons in the plasma are kept close to the sputtering target by direction of the electrons to the anode via an apertured baffle between the magnetrons.

An apparatus according to the present invention includes a pair of magnetrons having targets and disposed within a sputtering chamber, the targets positioned adjacent to each other and acting as a common sputtering area for the deposition of a film; an alternating current power supply connected to the magnetrons so that each target in the pair alternately functions as a sputtering cathode and then as an anode according to the frequency of the alternating current; and a shielding means between the magnetrons, the shielding means having apertures positioned to direct electrons to the anode as the targets alternate as the sputtering cathode and as the anode.

A method according to the present invention includes providing carbon-containing targets positioned side-by-side in an evacuated environment; flowing a gas into the evacuated environment to a pressure capable of sustaining sputtering; cyclically sputtering from the targets to form a carbon film on a medium; and providing apertures between the targets to enhance the movement of electrons between the targets during sputtering.

BRIEF DESCRIPTION OF THE DRAWINGS

The invention will be better understood by reference to the figures of the drawings,wherein like numbers denote like parts throughout and wherein.

DESCRIPTION OF THE PREFERRED EMBODIMENTS

Figure 1A:
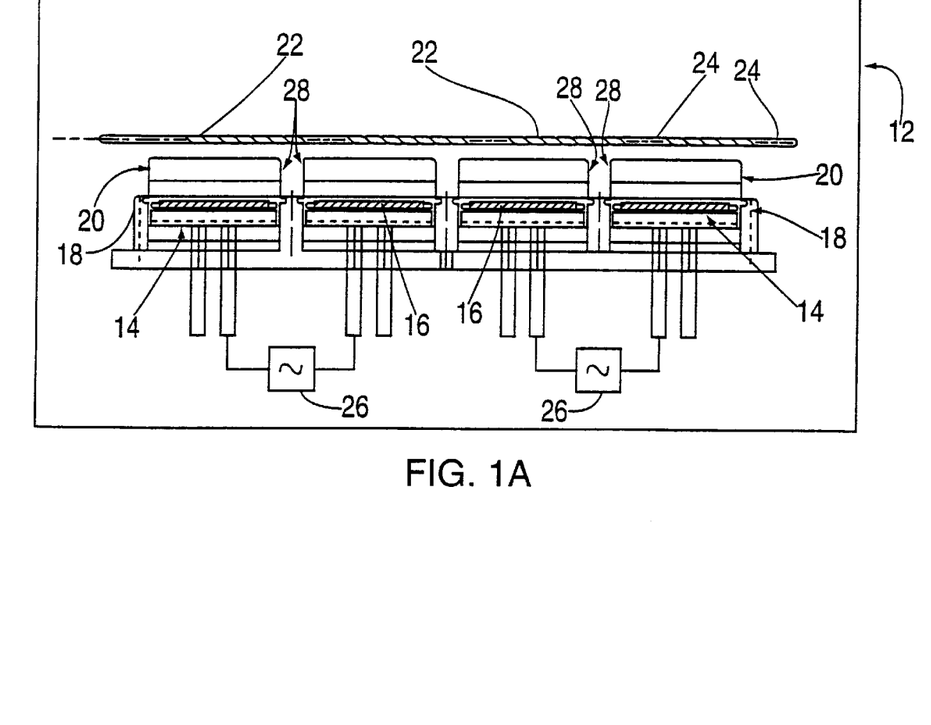
FIG. 1A is a cross-sectional plan view of a sputtering apparatus according to the present invention.
Figure 1B:
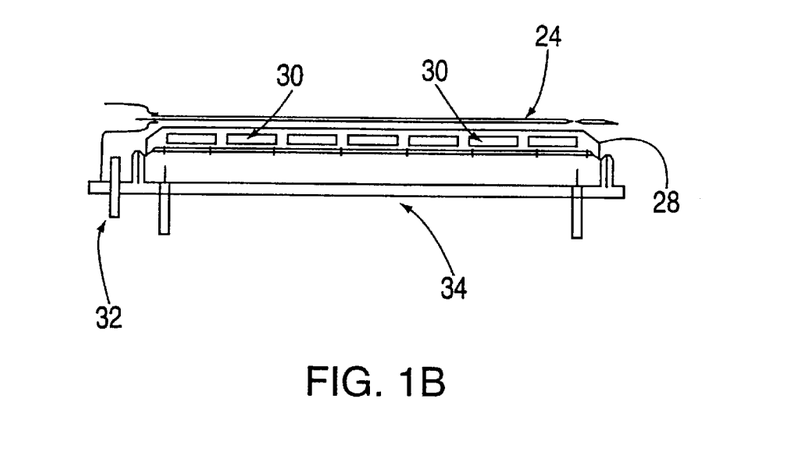
FIG. 1B is a side view of an apertured shield for an apparatus according to the present invention.

Dielectric films may be deposited using a sputtering apparatus according to the present apparatus, as exemplified in FIGS. 1A and 1B.

Generally, such an apparatus 10 includes conventional elements utilized in magnetron sputtering, e.g., a sputtering chamber 12, one or more pairs of magnetrons 14 with targets 16 composed of the material to be deposited and located along the sides of the chamber, gas distribution lines 18 to introduce the sputtering gas and optionally, though preferred, shields 20 to intercept low angle sputtering flux prior to deposition onto substrates 22 in a carrier 24 as described in the *Handbook of Thin Film Deposition Processes and Techniques*, edited by Klaus Schuegraf, Noyes Publications, 1988, pages 291–317. Additional magnetrons, shields and gas distribution lines, not shown in FIG. 1A, can also be positioned within the sputtering chamber to deposit film on each side of the substrates.

In an apparatus according to the present invention, the magnetrons are adjacent, i.e., side-by-side, each other on the side of the chamber and each pair is coupled to an alternating current power supply 26 Because of the cyclic nature of the current being supplied to the magnetron pair, each target in the pair sputters for one-half of the cycle, i.e., the magnetron acts as the cathode, while for the other half of the cycle, the magnetron acts as an anode, discharging any charge buildup. Alternating current power desirably has a high enough frequency so that the periods during which charge buildup occurs are very short to reduce the probability of arcing, but not so high as to require the extensive shielding needed with radio and other high frequency power supplies. A suitable power supply is a 10 kW mid-frequency power supply model PE 10K manufactured by Advanced Energy Company of Fort Collins, Co. Shielding of the sputtering chamber from this power supply is unnecessary.

In addition to shields to intercept low angle flux, a sputtering apparatus according to the present invention has an apertured shield 28 with a plurality of openings 30 as shown in FIG. 1B. The apertured shield may be mounted, for example, by brackets 32, to a door 34 to the sputtering chamber and is positioned between coupled targets and oriented in the same plane as the targets. The openings are transverse to the vertical axis of the apertured shield, thereby providing through channels between the magnetrons to direct electrons to the appropriate target in the pair acting as the anode at a given time during the cycle.

The dimensions of the shield and the number of apertures therethrough depend upon the dimensions of the magnetrons used and the extent of shielding desired. In an apertured shield having dimensions 12.8 cm×5.0 cm×86.5 cm (length by width by height), it is useful to have seven openings 1.9 cm×9.6 cm along the length of shield so that transverse paths are provided for electron travel between targets. The apertured shield may be constructed of a material such as stainless steel.

Desposition may be onto a static substrate or a substrate being transported past the magnetrons.

Properties of sputtered films are affected by process parameters such as gas flow rate and sputtering pressure. The effect of changes to these process parameters on the properties of carbon films is summarized in Table 1. The carbon films in Table 1 where desposited on 95 mm nickel-plated aluminum disks on which 1100 Å Cr and 520 Å CoCrTa films were previously deposited at 190° C.

TABLE 1

| Sputtering Pressure, mTorr | Gas Flow, sccm/target | Carbon Thickness, Å | H %* | G Peak, $cm^{-1}$ | CSS** Overall Avg. Stiction, g | Overall Avg. Peak Stiction, g |
|---|---|---|---|---|---|---|
| 8 | 30 | 252 | 15.6 | 1556 | 9.1 | 15.6 |
|   |   | 252 | 12.4 | 1559 |   |   |
|   |   | 242 | 17.4 | 1558 |   |   |

TABLE 1-continued

| Sputtering | | | | | CSS** | |
|---|---|---|---|---|---|---|
| Pressure, mTorr | Gas Flow, sccm/target | Carbon Thickness, Å | H %* | G Peak, cm$^{-1}$ | Overall Avg. Stiction, g | Overall Avg. Peak Stiction, g |
| 8 | 42 | 292 | 27.9 | 1566 | 10.9 | 15.7 |
|   |    | 277 | 26.9 | 1568 |      |      |
|   |    | 369 | 39.3 |      |      |      |
| 12 | 30 | 245 | 19.5 | 1558 | 11.8 | 16.0 |
|   |    | 236 | 21.4 | 1559 |      |      |
|   |    | 270 | 21.4 | 1557 |      |      |
| 12 | 42 | 307 | 35.8 | 1571 | 9.5  | 15.4 |
|   |    | 257 | 29.8 | 1571 |      |      |
|   |    | 273 | 34.2 | 1570 |      |      |
| 10 | 36 | 268 | 28.2 | 1562 | 9.8  | 16.1 |
|   |    | 258 | 22.4 | 1562 |      |      |
|   |    | 289 | 27.7 | 1562 |      |      |

*Determined by optical properties correlated to v % H.
**CSS performance over 10,000 cycles with 70% MIG head, 2 1/4 microinch flying height, 4.75 gram load average, average ambient temperature 69° F., 28% average relative humidity.

Figure 2:
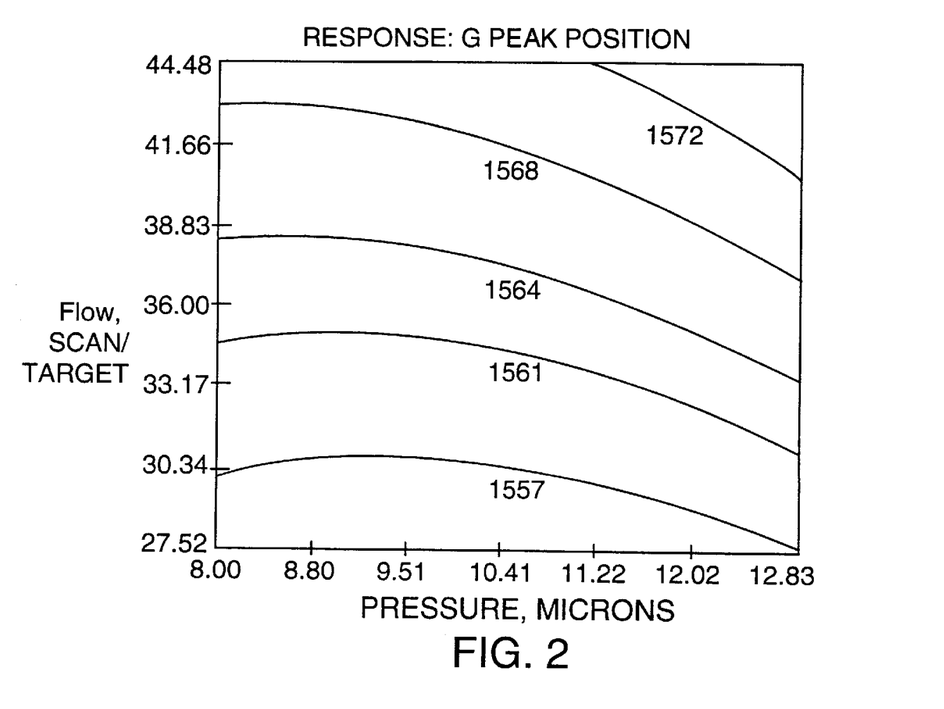
FIG. 2 is a graph of the variation in Raman G Band Peak for carbon films as a function of gas flow rate and pressure.

Wear performance appears to be correlated to Raman G Band Peak position. Polycrystalline graphite has bands at about 1357 cm$^{-1}$ and 1580 cm$^{-1}$ (the "G Band"). Data suggests that films having G Band Peak positioned between 1357 cm$^{-1}$ and 1580 cm$^{-1}$ have good CSS performance, as shown in Table 1. Modeling studies indicate that the G Band Peak position is influenced by flow rate and pressure, as shown in FIG. 2, but to a lesser degree than the effects of temperature.

Figure 3:
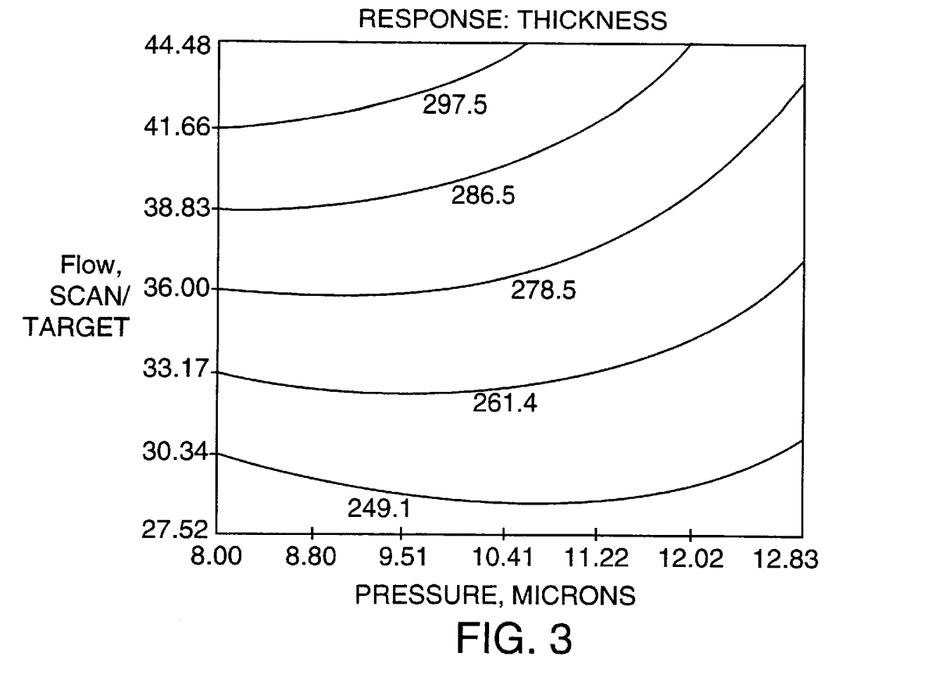
FIG. 3 is a graph of the variation of carbon film thickness as a function of gas flow rate and pressure.
Figure 4A:
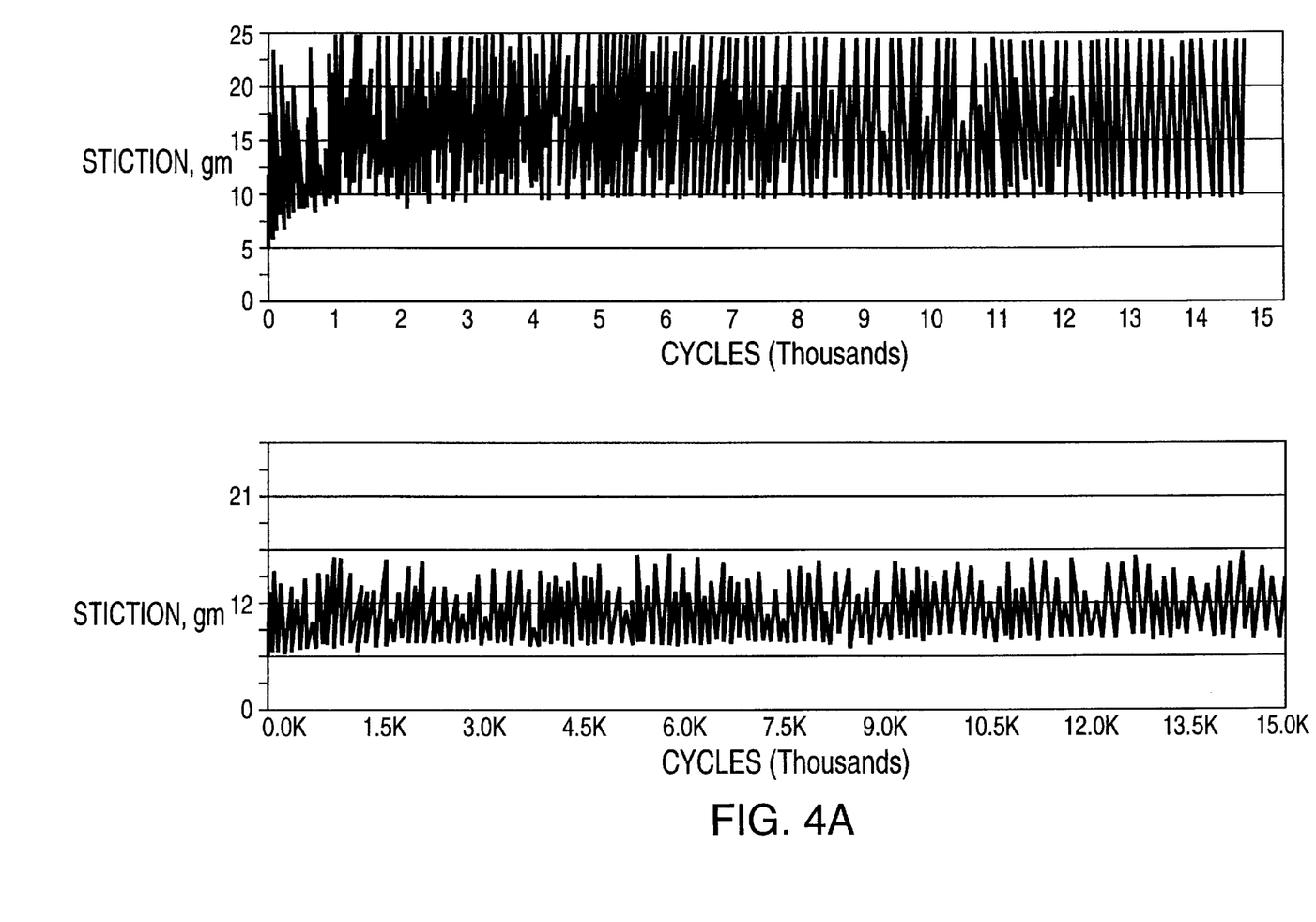
FIG. 4A–4D illustrate the effect of temperature on CSS performance for magnetic recording disks.
Figure 4B:
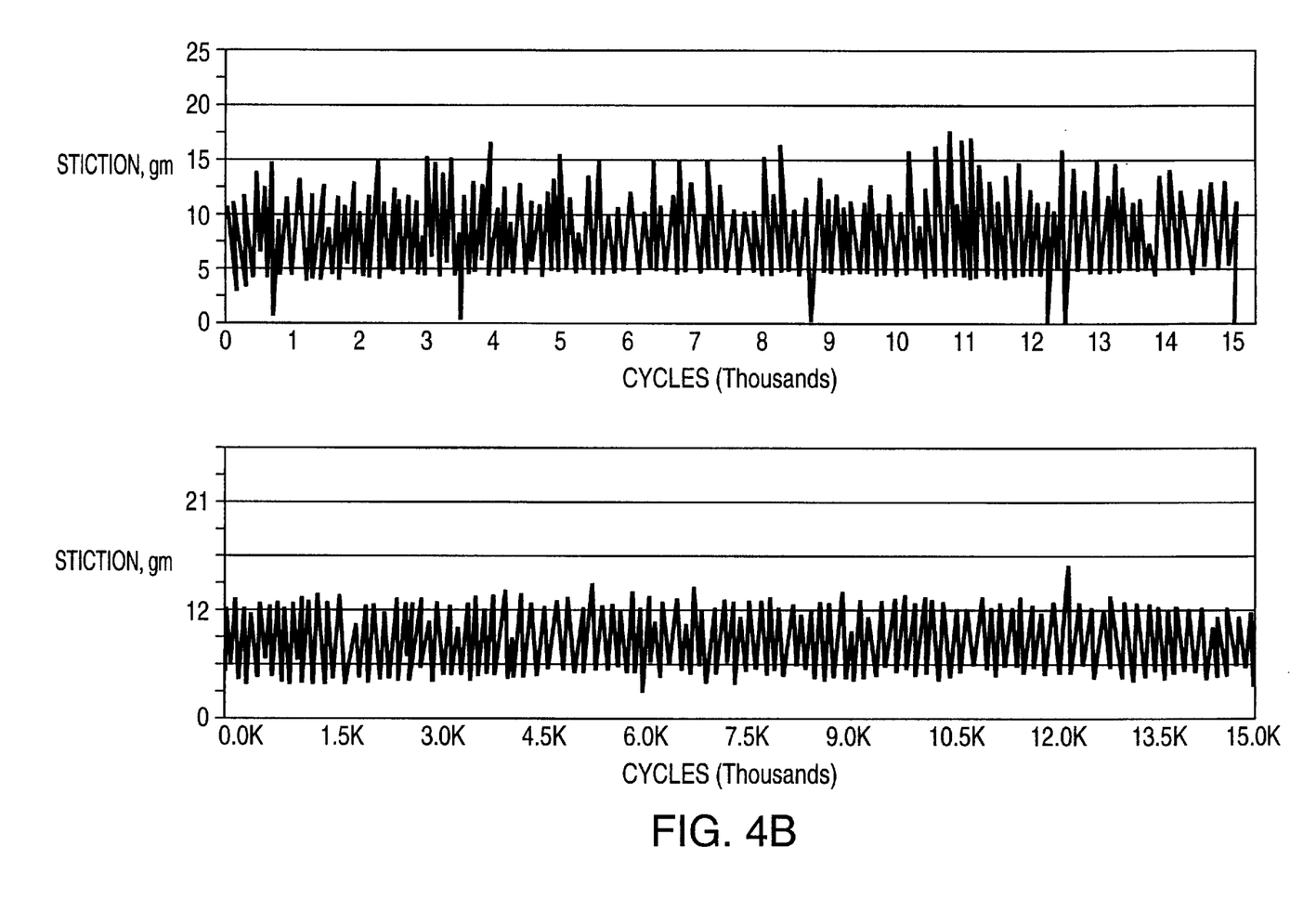
Figure 4C:
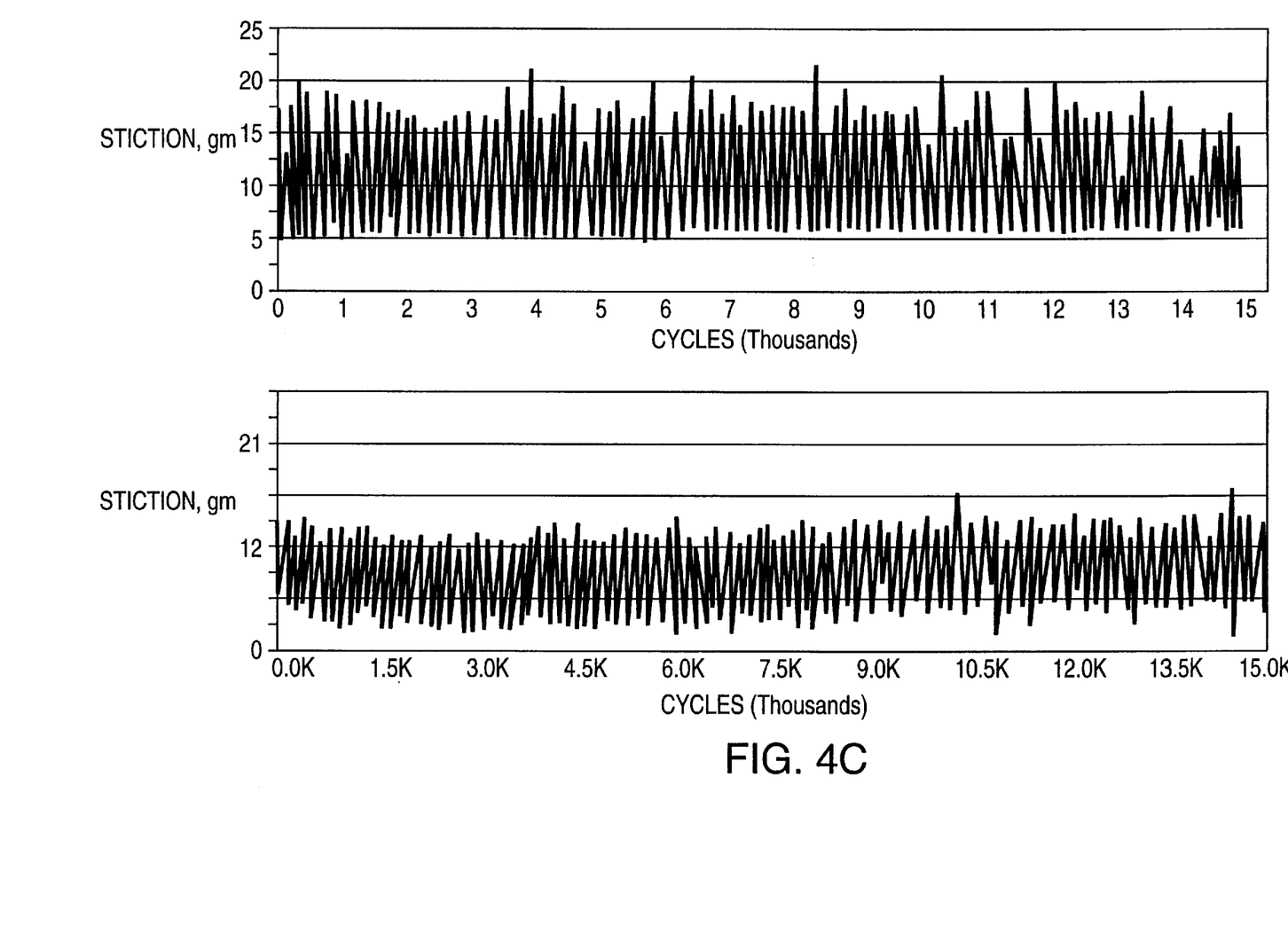
Figure 4D:
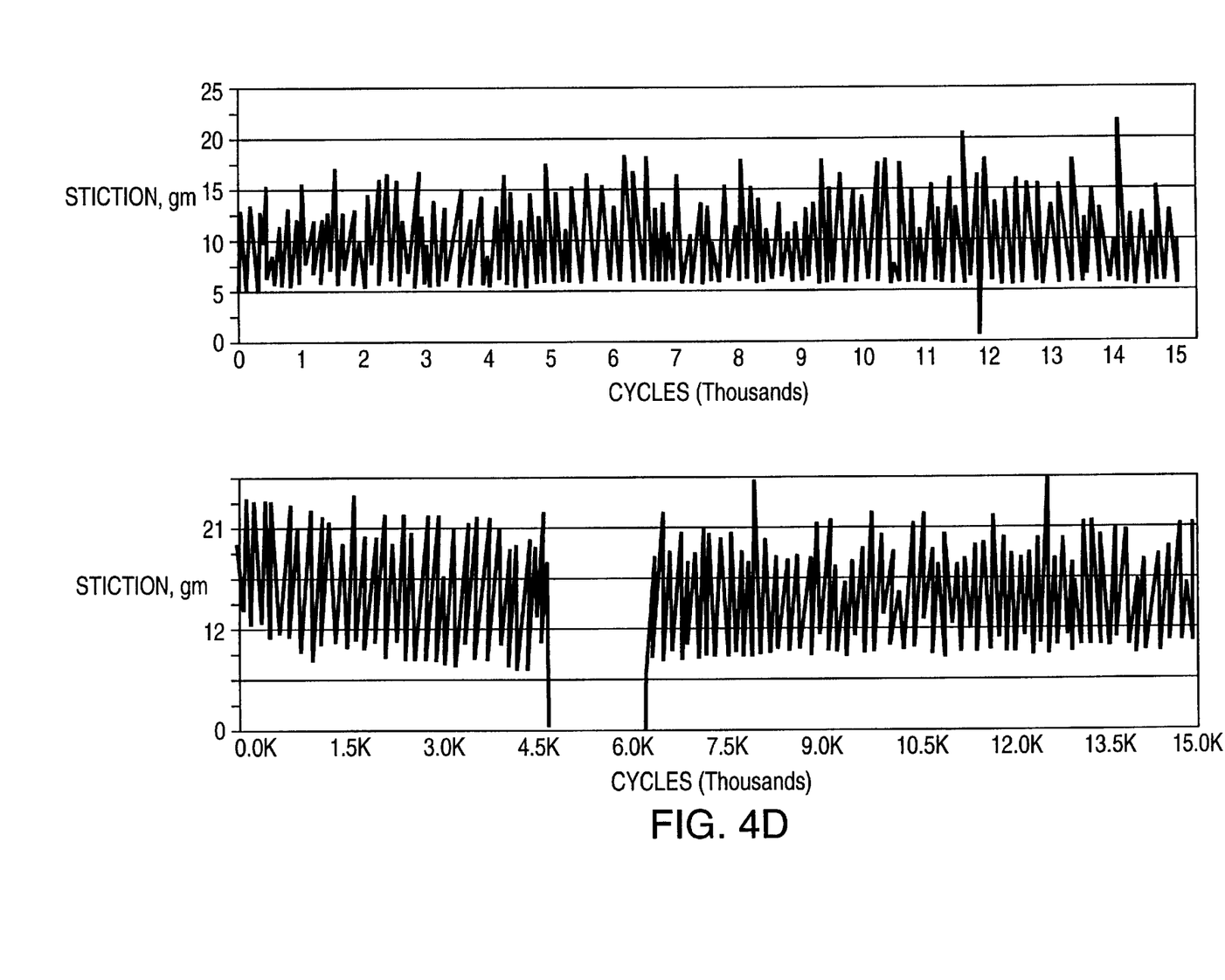

FIG. 3 presents graphically a qualitative modeling study of the effect on carbon film thickness of changes in gas flow rate and sputtering pressure. As can be seen from this figure, increasingly thick films can be deposited in the same period of time by increasing the flow rate. Increasing pressure tends to decrease the rate of film deposition.

Hardness also varies with sputtering process parameters. Hydrogen content of about 15–50 v % in carbon films has been associated with adequate film hardness for overcoats for magnetic thin film recording media. (These values are based on analyses using an N&K Carbon Film Analyzer which measured optical properties correlated with hydrogen content.) This is an especially attractive feature for carbon overcoats for magnetic thin film recording media and therefore, it may be desired to carry out sputtering in the presence of hydrogen gas or a hydrocarbon gas, in addition to the inert sputtering gas, typically argon. In particular, hydrogenated carbon films have been produced by alternating current magnetron sputtering methods of the present invention in an atmosphere of argon having 15 v % ethylene.

Internal film stress plays an important role in the utility of a sputtered film. For example, it is desirable to avoid either highly compressively or highly tensile stressed film conditions for suitable performance as a carbon overcoat for a magnetic thin film recording media.

The temperature at which an overlying carbon film is deposited may be significantly influenced by the heating requirements for layers previously deposited on the substrate, e.g., nucleating or magnetic thin film recording layers.

In particular, temperature at which deposition occurs can play a significant role in determining film properties. For example, it may be desired to deposit carbon films over CoCrTa magnetic recording layers. However, the temperature at which such a magnetic film is deposited may adversely affect the subsequent deposition of the carbon layer. Thus, it may be desirable to cool the substrate after magnetic deposition and prior to deposition of the carbon film.

FIG. 4 illustrates the relative CSS performance over 15,000 cycles for two groups of magnetic recording disks. In the first group, a 200 Å carbon film was deposited onto substrates (nickel plated aluminum-magnesium/550 Å Cr/500 Å CoCrTa) at 190° C. and in the second group the carbon film was deposited over substrates at 140° C. The disks were lubricated with PFPE layers of 18 Å, 21 Å, 24 Å, and 27 Å. The disks for which the carbon film was deposited at 140° C. had relatively lower overall average and average peak stiction values and therefore more attractive CSS performance.

The following nonlimiting example illustrates a method according to the present invention for depositing a hydrogenated carbon film onto a magnetic thin film recording medium.

EXAMPLE 1

The deposition system was a vertical in-line sputtering system described in U.S. patent application Ser. No. 07/681,866, filed Apr. 4, 1991, and U.S. patent application Ser. No. 08/121,959, filed Sep. 15, 1993, both applications assigned to the assignee of the present invention and incorporated herein in their entireties by reference. In the carbon sputtering chamber, two planar magnetrons (90 cm×13.75 cm×1.81 cm), each with a 99.9 wt % graphite target (supplied by Tosoh Specialty Metals Div., Inc. of Grove City, Ohio), were mounted adjacent to each other along the line of substrate travel. Each pair of targets was 6.1 cm apart. The magnetrons were equipped with surrounding low angle shields, and three gas distribution ports along each side. An apertured shield, 12.8 cm×5.0 cm×86.5 cm, was positioned between the coupled magnetrons. Seven apertures, 1.9 cm×9.6 cm, were located along the length of the apertured shield. The power supply for each pair of targets was the Advanced Energy Model PE 10K capable of supplying 10 kW maximum alternating current to each target.

Sputtering was carried out in the evacuated sputtering chamber backfilled with a gas mixture of argon with 15 v % ethylene, prepared by Scott's Specialty Gases of Fremont, Calif., flowing at about 36 sccm per target to provide a sputtering pressure of about 10 microns (10 mTorr). About 7 kW was applied to each target at a frequency of 40 kHz.

The substrates, textured 95 mm nickel plated aluminum-magnesium disks having 1100 Å Cr and 520 Å CoCrTa films, were transported past the graphite targets at a speed of 2.5 cm/sec. The substrates were allowed to cool to about 190° C. prior to deposition of the hydrogenated carbon film. The substrate temperature for optimizing magnetic properties of the CoCrTa film was about 225° C. Under these conditions, a 300 Å hydrogenated carbon film was deposited on each side of the substrate in about 30 seconds.

Although specific process parameters are enumerated in this example, it will be understood by those skilled in the art, that specific process parameters depend on several factors including the composition and morphology of the film sought to be deposited and the specific sputtering equipment used.

While not wishing to be bound to any theory of operation, it is believed that the formation, according to the present invention, of hydrogenated carbon films suitable for overcoats in magnetic recording media involves both sputtering (i.e., momentum transfer) and dissociation of ethylene to provide the hydrogen that is incorporated into the carbon sputtered from the target. Raman spectral analysis, including G Band peak data such as that presented in Table 1, suggest that process conditions can be selected such that little, if any, hydrogen is being incorporated into the film by reaction of hydrogen-containing species and carbon to form a relatively soft, substantially polymeric carbon film. Rather, the data suggest that a more polycrystalline carbon structure is being formed and that this structure is responsible for excellent wear properties.

While the invention has been described in connection with specific embodiments thereof, it will be understood that it is capable of further modification, and this application is intended to cover any variations, uses or adaptations of the invention following, in general, the principles of the invention and including such departures from the present disclosure as come within known or customary practice in the art to which the invention pertains and as may be applied to the essential features hereinbefore set forth and as fall within the scope of the invention and the limits of the appended claims.

We claim:

1. A method for sputtering a carbon film for a magnetic thin film recording medium, comprising the steps of:
   a) providing carbon-containing targets positioned side-by-side in an evacuated environment;
   b) flowing a gas into the evacuated environment to a pressure capable of sustaining sputtering;
   c) cyclically sputtering from the targets, which alternately act as a sputtering cathode and as an anode, to form the carbon film on the medium; and
   d) providing an apertured baffle between the targets to enhance the movement of electrons toward a target anode during the sputtering step.

2. A method according to claim 1, wherein step c) is carried out under shielding conditions that intercept obliquely incident sputtered flux from the targets.

3. A method according to claim 1, wherein the gas comprises a hydrocarbon gas.

4. A method according to claim 3, wherein the carbon film is hydrogenated and comprises and hydrogen from the hydrocarbon gas.

5. A method according to claim 3, wherein the hydrocarbon gas comprises ethylene.

6. A method according to claim 4, wherein the hydrogenated carbon film has a substantially diamond-like structure.

7. A method according to claim 1, wherein the medium comprises multiple layers and step c) is carried out at a temperature which is relatively reduced from the temperature at which an underlying layer is deposited.

8. A method for sputtering a dielectric film onto a substrate, comprising the steps of:
   a) providing alternating current power to side by side targets so that the targets alternately act as a sputtering cathode and as an anode in accordance with the frequency of the alternating current; and
   b) moving the substrate past the targets under shielding conditions provided by an apertured baffle positioned between said targets that directs electrons between the targets to enhance the rate of sputtering of the film.

9. A method according to claim 8, comprising:
   depositing a magnetic thin film recording layer onto the substrate; and subsequently
   sputtering, in an atmosphere comprising argon and a hydrocarbon gas, a hydrogenated carbon dielectric layer over the magnetic thin film recording layer, the carbon layer comprising carbon from carbon-containing targets and hydrogen from the hydrocarbon gas.

10. A method according to claim 9, wherein the dielectric film comprises carbon.

11. A method according to claim 9, wherein the substrate is moved past the targets in an environment comprising a hydrocarbon gas.

12. A sputtering apparatus, comprising:
   a) a pair of magnetrons disposed within a sputtering chamber, the magnetrons having side-by-side targets and acting as a common sputtering area for the deposition of a film;
   b) an alternating current power supply connected to the magnetrons so that each target in the pair alternately functions as a sputtering cathode and then as an anode according to the frequency of the alternating current; and
   c) a shielding means between the magnetrons, the shielding means having apertures positioned to direct electrons to the anode as the targets alternate as a sputtering cathode and as the anode.

13. A sputtering apparatus according to claim 12, wherein the targets comprise a dielectric material.

14. A sputtering apparatus according to claim 13, wherein the dielectric material comprises carbon.

15. A sputtering apparatus according to claim 12, further comprising a source for introducing a gaseous hydrocarbon in the sputtering chamber.

* * * * *